US006677850B2

(12) United States Patent
Dames

(10) Patent No.: US 6,677,850 B2
(45) Date of Patent: Jan. 13, 2004

(54) LAYERED CURRENT SENSOR

(75) Inventor: Andrew Nicholas Dames, Cambridgeshire (GB)

(73) Assignee: Sentec Ltd. (GB)

(*) Notice: Subject to any disclaimer, the term of this patent is extended or adjusted under 35 U.S.C. 154(b) by 0 days.

(21) Appl. No.: 09/747,033

(22) Filed: Dec. 22, 2000

(65) Prior Publication Data

US 2002/0024334 A1 Feb. 28, 2002

Related U.S. Application Data

(63) Continuation of application No. PCT/GB99/02007, filed on Jun. 25, 1999.

(30) Foreign Application Priority Data

Jun. 25, 1998 (GB) ................................................ 9813668

(51) Int. Cl.[7] .............................................. H01C 1/012
(52) U.S. Cl. ........................ 338/307; 338/319; 338/254; 338/320; 338/49; 338/48; 338/325; 338/313
(58) Field of Search .......................... 338/48, 49, 319, 338/320, 307, 239, 260, 325, 313, 254

(56) References Cited

U.S. PATENT DOCUMENTS

| 2,518,941 | A | * | 8/1950 | Satchwell et al. | 338/254 |
|---|---|---|---|---|---|
| 2,868,937 | A | * | 1/1959 | Charbonneau | 338/319 |
| 3,361,936 | A | * | 1/1968 | Umantsev | 338/320 |
| 3,512,115 | A | * | 5/1970 | Solojw | 338/320 |
| 3,638,162 | A | * | 1/1972 | McWade | 338/320 |
| 3,668,600 | A | * | 6/1972 | Schuberth et al. | 338/320 |
| 3,680,013 | A | * | 7/1972 | Pye | 333/81 R |
| 4,272,739 | A | * | 6/1981 | Nesses | 333/81 A |
| 4,310,812 | A | * | 1/1982 | DeBloois | 338/320 |
| 4,492,919 | A |   | 1/1985 | Milkovic | 324/127 |
| 4,580,095 | A |   | 4/1986 | De Vries | 324/126 |
| 4,654,627 | A | * | 3/1987 | Harkness | 338/319 |
| 4,794,326 | A |   | 12/1988 | Friedl | 324/117 R |
| 5,083,081 | A |   | 1/1992 | Barrault et al. | 324/126 |
| 5,164,698 | A | * | 11/1992 | Palanisamy | 338/307 |
| 5,214,407 | A | * | 5/1993 | McKim, Jr. et al. | 338/49 |
| 5,242,225 | A | * | 9/1993 | Kasanami et al. | 374/185 |
| 5,300,917 | A | * | 4/1994 | Maue et al. | 338/49 |
| 5,701,253 | A |   | 12/1997 | Mayell et al. | 364/483 |
| 5,872,504 | A | * | 2/1999 | Greitschus et al. | 338/320 |

FOREIGN PATENT DOCUMENTS

| DE | 3324224 | 12/1984 | G01R/15/02 |
|---|---|---|---|
| EP | 445048 | 9/1991 | H01H/71/12 |
| EP | 500976 | 9/1992 | G01R/1/20 |
| EP | 612081 | 8/1994 | H01C/1/144 |
| JP | 5258924 | * 10/1993 | 338/320 |

* cited by examiner

Primary Examiner—Karl D. Easthom
(74) Attorney, Agent, or Firm—Schwegman, Lundberg, Woessner & Kluth, P.A.

(57) ABSTRACT

An electrical current sensor and utility electricity meter, the current sensor comprising a π resistor shunt configuration, wherein the resistors comprise layered conductors at substantially equal temperatures to provide a zero temperature coefficient sensor. A fiscal electricity meter is described together with a four-layered current sensor fabricated using PCB techniques.

3 Claims, 4 Drawing Sheets

LAYERED CURRENT SENSOR

CROSS-REFERENCE TO RELATED APPLICATIONS

This application is a continuation of International Patent Application No. PCT/GB99/02007, filed on Jun. 25, 1999, which in turn is an international filing of Great Britain Application No. 9813668.2, filed on Jun. 25, 1998, all of which are incorporated herein by reference.

FIELD OF THE INVENTION

This invention relates to the field of electrical current sensing, particularly but not exclusively for use as a current shunt sensor used in a fiscal utility electricity meter.

BACKGROUND

Electrical current sensing is used in many applications. There are two common methods used to sense the current. The first method detects and measures the magnetic field produced by the current flowing in a conductor (inductive systems). For example U.S. Pat. No. 4,794,326 describes an arrangement comprising a planar conductor coupled inductively by a transformer arrangement to the sense circuit. A second method of current sensing uses a 'shunt' resistance in the current path to generate a voltage across the shunt resistance in proportion to the current flowing. In U.S. Pat. No. 5,701,253 a utility electricity meter employing a current shunt is described.

In U.S. Pat. No. 4,492,919, a planar current shunt is described. The invention incorporates an electrical transformer to provide isolation between the conductor carrying the current and the sensing circuit.

SUMMARY OF THE INVENTION

According to the present invention there is provided a layered current divider comprising a conductor carrying the electrical current and two resistors, all the resistors mounted to occupy substantially the same physical area in a layered structure, wherein the temperature difference between the layers is substantially zero.

The layered structure provides electrical isolation between the main current conductor and the two resistors, whilst providing a thermal conductive path between the layers. This ensures that for any small portion of the main current carrying conductor area, there is a similar area portion on the two other resistors and all three areas are substantially at the same temperature. This ensures that the current divider has substantially zero temperature co-efficient independent of the temperature co-efficient of the metal resistivity comprising the current carrying conductor and two other resistors.

For optimum thermal performance, the main current carrying conductor may be divided into two equal layers. The heat generating main conductor comprises two outer layers and the two other, non-heat generating, resistors comprise the inner layers. The layered structure is isothermal across the thickness.

According to a further aspect of the invention there is provided a current sensor for measuring electrical current flow, comprising a layered current divider and a low input impedance differential current amplifier. The amplifier produces a large signal output directly proportional to the current flowing through the current divider.

One benefit of the current divider when fabricated from PCB is the ability to integrate the current divider with existing electronics manufactured using PCB interconnect technology. The current divider can be integrated directly onto the same PCB used to interconnect the electrical components.

According to a further aspect of the invention there is provided an electricity meter for measuring the electrical power consumed by a load, comprising a layered current sensor, a voltage sensing means and a power computation means.

BRIEF DESCRIPTION OF THE DRAWINGS

Embodiments of the invention will now be described, by way of example, with reference to the accompanying drawings, in which.

DETAILED DESCRIPTION

Figure 1:
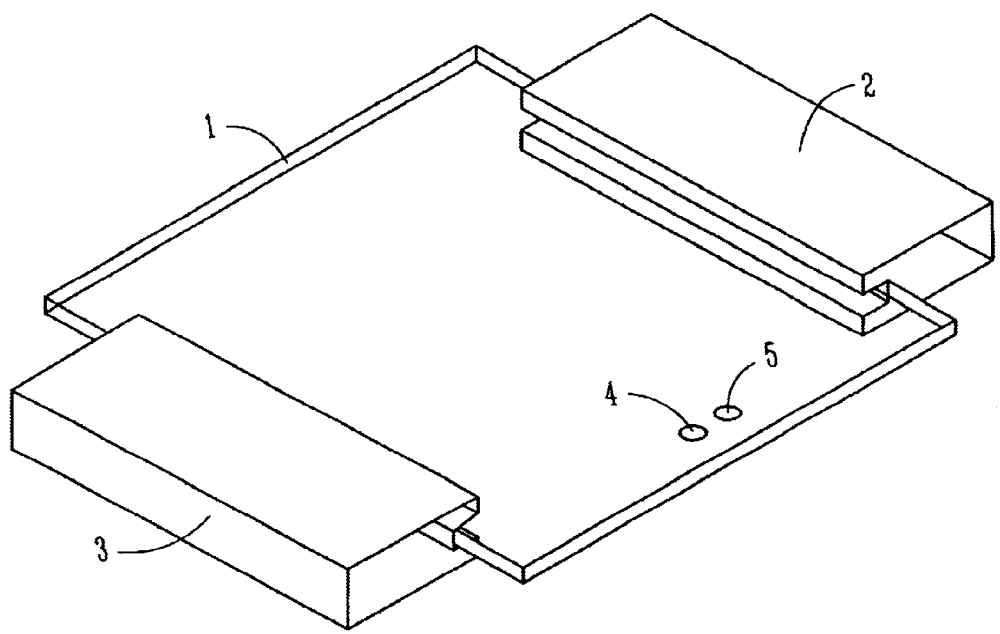
FIG. 1 illustrates the current divider element.

The current divider element is shown in FIG. 1 and comprises a 4 layer printed circuit board (PCB), 1. The measured current is connected to the device by means of copper bars 2 and 3. The current divider output is copper pads 4 and 5. The current divider may be connected to a low input impedance differential current amplifier circuit that provides adequate gain to produce a voltage output signal.

For optimum temperature performance, the current density in the current carrying resistor should be uniform. This is achieved by copper bars 2 and 3.

Figure 2:
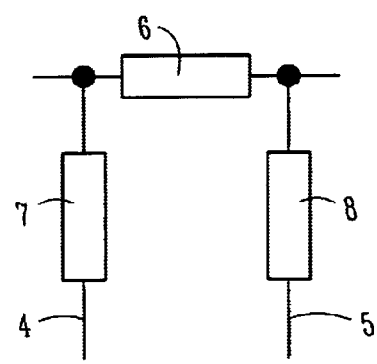
FIG. 2 illustrates the electrical circuit of the $\pi$ configuration current divider.

FIG. 2 is the electrical circuit diagram of the current divider. The sensed current flows though resistor 6. Two resistors, 7 and 8, are connected to resistor 6 and have outputs 4 and 5.

Figure 3:
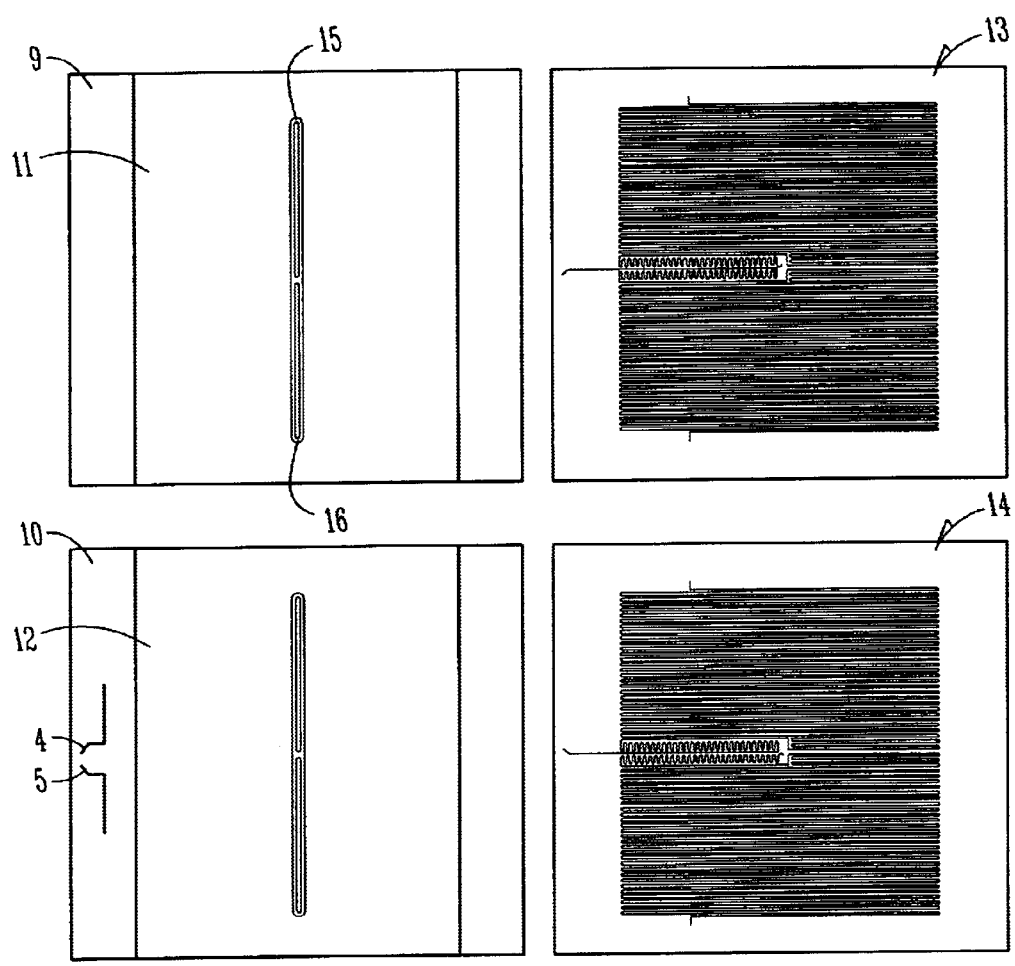
FIG. 3 shows the conductor pattern for the layers within the current divider.

FIG. 3 illustrates the four conductor patterns comprising the PCB, 1. The total PCB thickness is 1 mm and the inner layers are ~80 $\mu$m apart. The top layer, 9, and the bottom layer, 10, comprise two copper tracks, 11 and 12, providing a low resistance main conductor path that is resistor 6. In one embodiment the copper track, 11 and 12 are 2.5 cm square and fabricated from 5 ozin (175 $\mu$m) copper foil. The resistance of the main conductor, resistor 6, is approximately 50 $\mu$ohms.

The two resistors, 7 and 8, comprise track patterns on the inner PCB layers 13 and 14. The copper thickness of layers 13 and 14 is 5 $\mu$m and each resistor comprises ~150 cm of track 75 $\mu$m wide distributed over an area identical to that occupied by the main conductor tracks, 11 or 12. The resistance of resistors 7, 8 is approximately 70 ohms.

The electrical output connections to the resistors 7 and 8 are by copper area (pads) 4 and 5. The resistors are connected to the main conductor at points 15 and 16 on layer 9. Similar connections exist on layer 10. The conductor area occupied by the track 11 that comprises resistor 6 is defined by the physical positions of connection points 15 and 16 and the track width.

Figure 4:
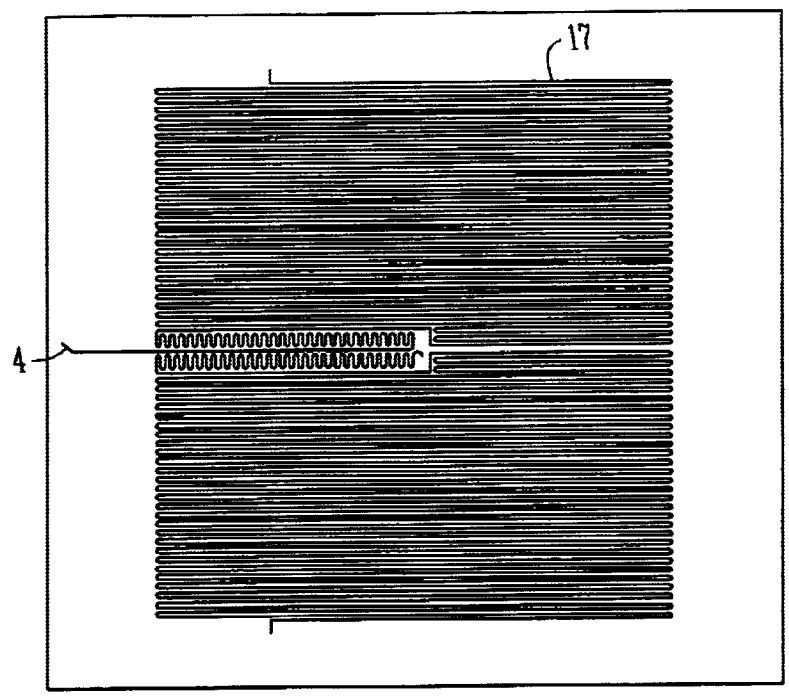
FIG. 4 shows in detail the conductor pattern for the first resistor.
Figure 5:
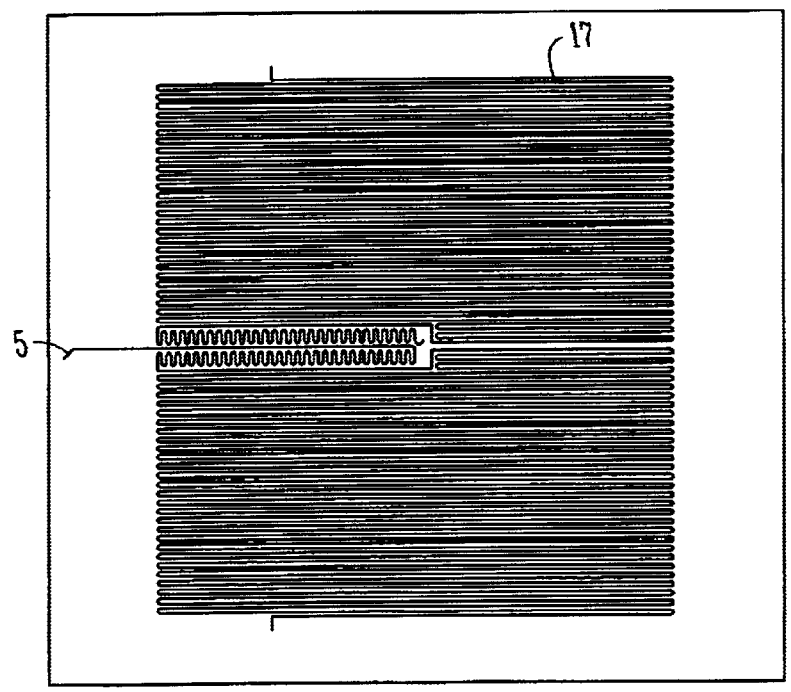
FIG. 5 shows in detail the conductor pattern for the second resistor.

FIG. 4 and FIG. 5 show in detail the track patterns of the resistors, 7 and 8. The track, 17 and 18 comprises a 'zig-zag' pattern folded into a PCB area identical to that occupied by resistor 6. Electrical interconnects are provided by vias at the appropriate positions to provide the circuit shown in FIG. 2. The electrical conductor paths are arranged with substantially zero inductive coupling between the resistors, 7 and 8, and the current flowing in the resistor 6. Further, the track patterns 17 and 18 have substantially zero coupling with an a.c. magnetic field vector in any direction that has uniform magnitude across the area of the current sensor.

The current divider is interfaced to low input impedance differential current amplifier circuit that provides a voltage output signal. This amplifier provides an output signal proportional to the difference in current flowing though resistors 7 and 8. Such amplifier circuits are well known in the art.

The inventors have found that this embodiment has substantially zero temperature co-efficient over the operating temperature range of an electricity meter. The temperature co-efficient measured is approximately $\frac{1}{200}^{th}$ that of the copper conductor material.

The outer conductors in this embodiment can carry several hundred amps and therefore dissipate heat. The inner resistor layers do not carry substantial current and therefore do not generate heat. The four layer design has substantially zero temperature gradients across the thickness of the current divider. When combined with a low impedance differential current amplifier, the resulting current sensor has substantially zero temperature co-efficient.

Figure 6:
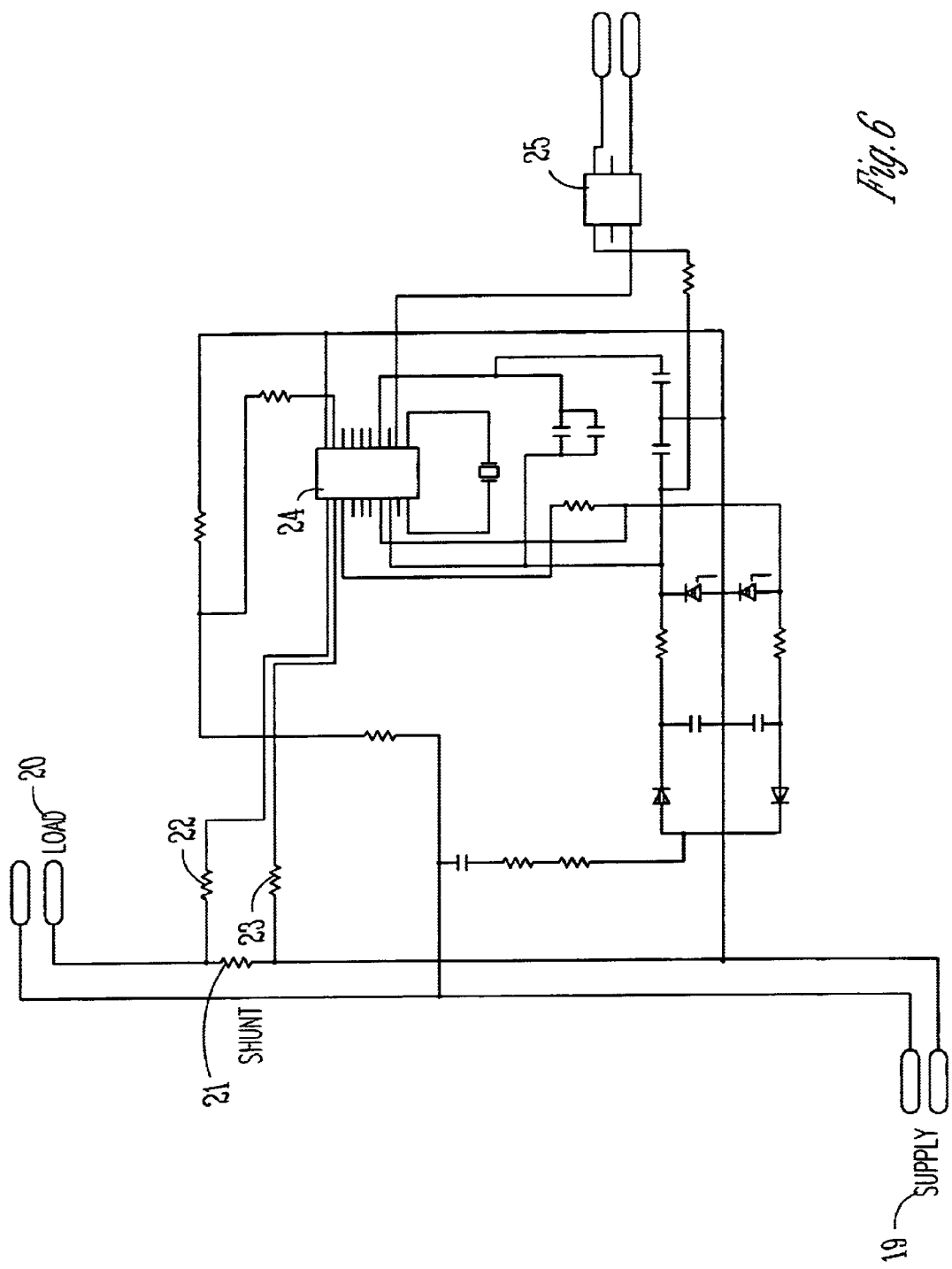
FIG. 6 is the circuit schematic for the electricity meter.

FIG. 6 illustrates the circuit diagram of an electricity meter. The circuit is well known in the art and the function is summarised below. Further details of this circuit may be found in the manufacturers' application note. The meter measures the power consumed from a supply, 19, by a load, 20. The current divider comprises resistors 21, 22 and 23. A standard integrated circuit (I.C.), 24, of type SA9602, manufactured by SAMES of South Africa provides the processing functionality to compute power drawn by the load. The IC provides a low impedance differential current amplifier circuit to monitor the current flowing from the supply to the load circuits. The current sensor division ratio is defined by the ratio of resistors 21 and 22, 23.

The division ratio is a function of the conductor pattern geometry and with the embodiment described the ratio is ~250,000 to 1,000,000 to 1. The IC further measures the voltage across the source and computes the power consumed from instantaneous current and voltage measurements. The power measured is output by means of pulses that are interfaced using an opto-isolator, 21, to provide output signal isolation from the supply voltages.

Further Embodiments

The layered current divider element described above is manufactured using standard PCB processes. Therefore the resistors are made from copper and epoxy fibre-glass provides electrical isolation between the layers. The current divider geometry can be changed in size as required to change the current division ratio. The current divider resistors can be computed from the track widths, thickness and lengths. The conductors may be manufactured from any conductor material provided the temperature co-efficient is substantially identical on each layer. The current divider structure may be manufactured using alternative methods other than chemical etching. The conductor paths may be manufactured by stamping from copper. The current divider layered structure can be achieved by suitable mechanical bonding of separately manufactured layers.

The current divider need not be limited to a four layer embodiment. In one embodiment, the device comprises two layers, with resistor 6 on one layer and resistors 7 and 8 comprising a second layer.

In a further three layer embodiment, the track comprising resistors 7 and 8 are shared between two copper layers on one PCB. The two layer PCB is bonded to a copper conductor comprising resistor 6. Suitable electrical connections are made to achieve the circuit configuration shown in FIG. 2.

Similarly more than four layer structures are conceivable, wherein each resistor comprising the current divider occupies two or more layers The current divider may be manufactured directly onto integrated circuits using multiple layer metal interconnects. IC manufacturing processes using mote than two layers of metal or interconnects are common.

In a final embodiment, the effect of non-uniform current density (J) in the main current carrying resistor, 6, is corrected. The other resistors comprising the current divider have a uniform track density over their layer area. Adjustments in the track to track spacing affect the track density. The current density in resistors 7 and 8 can be adjusted by altering the track density to match the current density in resistor 6 and provide a zero temperature coefficient current divider. Similarly the conductor thickness may be adjusted to provide the same effect.

What is claimed is:

1. A current sensor configured from an electrical resistor network comprising a shunt resistor, and respective first and second sense resistors all connected in a π-configuration wherein:

said π-configuration is formed by a first, second, a third and a fourth terminal circuit, said first sense resistor being connected between both said first and second terminals, said shunt resistor being connected between both said second and third terminals and said second sense resistor being connected between both said third and fourth terminals such that said first sense resistor is connected to a first leg of said shunt resistor and said second sense resistor is connected to a second leg of said shunt resistor;

said shunt and both said sense resistors are fabricated from substantially planar conductive material; and said shunt resistor and both said sense resistors each occupy substantially similar corresponding layer areas within a unitary structure comprising at least first, second and third layers, said shunt resistor being included in the first layer and both said sense resistors being included in at least the second and third layers.

2. A current sensor according to claim 1, wherein the unitary structure comprises at least first, second, third and fourth layers, the said shunt resistor being included in the first and second layers and both said sense resistors being included in the third and fourth layers.

3. A current sensor according to claim 1, wherein the unitary structure comprises at least first, second, third and fourth layers, the first and fourth layers being outer layers of the structure, these outer layers including the said shunt resistor for conducting a current flow to be sensed, both said sense resistors being included in at least the second and third layers of the structure.

* * * * *